United States Patent
Kim et al.

(10) Patent No.: US 6,501,306 B1
(45) Date of Patent: Dec. 31, 2002

(54) DATA OUTPUT CIRCUIT FOR SEMICONDUCTOR DEVICE WITH LEVEL SHIFTER AND METHOD FOR OUTPUTTING DATA USING THE SAME

(75) Inventors: Soo-Hwan Kim, Sungnam (KR); Young-Ho Suh, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/676,047

(22) Filed: Sep. 28, 2000

(30) Foreign Application Priority Data

Sep. 28, 1999 (KR) .............................. 99-41449

(51) Int. Cl.[7] .............................. H03B 1/00; H03K 3/00
(52) U.S. Cl. .......................... 327/112; 327/333; 326/63; 326/83
(58) Field of Search ................................. 327/112, 333; 326/81, 83, 86, 93, 95, 63, 68, 80

(56) References Cited

U.S. PATENT DOCUMENTS

| | | | | |
|---|---|---|---|---|
| 5,414,379 A | * | 5/1995 | Kwon | 327/170 |
| 5,627,487 A | * | 5/1997 | Keeth | 327/112 |
| 5,723,986 A | | 3/1998 | Nakashiro et al. | 326/81 |
| 6,107,830 A | * | 8/2000 | Okumura | 326/58 |
| 6,292,025 B1 | * | 9/2001 | Okumura | 326/58 |

* cited by examiner

Primary Examiner—Terry D. Cunningham
Assistant Examiner—Quan Tra
(74) Attorney, Agent, or Firm—Marger Johnson & McCollom, PC

(57) ABSTRACT

A data output circuit for a semiconductor device with a level shifter and a method for outputting data using the same. The data output circuit comprises an output buffer for receiving and latching an input data signal with a first voltage range in response to a clock control signal to provide a pair of output data signals, a high-impedance controller/level shifter circuit for outputting high-impedance drive data for the control of a high-impedance state through a pair of output lines according to a first logic state of a high-impedance control signal and for receiving the output data signal pair from the output buffer according to a second logic state of the high-impedance control signal and transferring pull-up and pull-down output data signals with a second voltage range through the output lines, and an output driver for maintaining a data output terminal at the high impedance state in response to the high-impedance drive data from the high-impedance controller/level shifter circuit and for performing an output driving operation in response to the pull-up and pull-down output data signals from the high-impedance controller/level shifter circuit to output final data externally through the data output terminal. A data output speed and a high-impedance transition speed are improved and an excellent driving capability is obtained.

6 Claims, 4 Drawing Sheets

DATA OUTPUT CIRCUIT FOR SEMICONDUCTOR DEVICE WITH LEVEL SHIFTER AND METHOD FOR OUTPUTTING DATA USING THE SAME

BACKGROUND OF THE INVENTION

1. Field of the Invention

The present invention relates in general to data input/output circuits, and more particularly to a data output circuit for a semiconductor device.

2. Description of the Prior Art

Recently, a larger number of CMOS transistors have been integrated on a silicon chip in proportion to a higher complexity of a semiconductor integrated circuit. In order to reduce power consumption and increase operating speed, an internal supply voltage of the chip is on a decreasing trend, for example, from 5V to 3.3V, 2.5V or less. In this regard, an internal supply voltage generation circuit has been provided in a typical integrated circuit chip such as a semiconductor memory chip for dropping an external supply voltage to generate a voltage necessary to internal circuits of the chip. To the contrary, a relatively high voltage has been required in increasing the capability of interfacing with external devices of the chip and the capability of driving specific internal transistors of the chip. To this end, a boosting circuit has often been employed in the integrated circuit chip for boosting the external supply voltage to provide the boosted voltage to desired circuits such as a word line.

A semiconductor device with the above internal supply voltage generation circuit has needed a data output circuit operable according to various external supply voltage levels to provide a suitable fit between internal signal interface levels and those of external devices. The data output circuit of the semiconductor device typically comprises an output buffer, high-impedance control circuit and output driver. The data output circuit further comprises a level shifter for voltage level conversion in addition to the above components. The level shifter is typically adapted to convert the level of output data with an internal supply voltage level into an external supply voltage level and transfer the resultant output data to an output terminal.

In the above output data circuit for the semiconductor device, the output buffer provides a primary output data signal pair, which is applied to the high-impedance control circuit for the generation of a secondary output data signal pair. Subsequently, the generated secondary output data signal pair is converted in voltage level by the level shifter and then transferred as the final output data externally through the output driver. However, the above-mentioned output data circuit has encountered various problems in output operation such as, for example, a low data output speed, a low high-impedance transition speed and an output signal skew occurring in pull-up and pull-down operations, which will be more clearly recognized from the following detailed description taken in conjunction with the preferred embodiments of the present invention.

SUMMARY OF THE INVENTION

Therefore, the present invention has been made in view of the above problems, and it is an object of the present invention to provide a data output circuit for a semiconductor device which is capable of solving the above problems.

It is another object of the present invention to provide a data output circuit which is capable of increasing or maximizing a data output speed and a high-impedance transition speed.

It is a further object of the present invention to provide a data output circuit which is capable of minimizing a skew between output signals in pull-up and pull-down operations.

It is yet another object of the present invention to provide a level shifting circuit which is capable of increasing or maximizing a data output speed and a high-impedance transition speed while maintaining an excellent driving capability and a low leakage current characteristic.

In accordance with one aspect of the present invention, the above and other objects can be accomplished by a provision of a data output circuit for a semiconductor device, the data output circuit comprising an output buffer for receiving and latching an input data signal with a first voltage range in response to a clock control signal to provide a pair of output data signals; high-impedance controller/level shifter means for outputting high-impedance drive data for the control of a high impedance state through a pair of output lines according to a first logic state of a high-impedance control signal and for receiving the output data signal pair from the output buffer according to a second logic state of the high-impedance control signal and transferring a pull-up output data signal and a pull-down output data signal through the output lines, with each of the pull-up and pull-down output data signals having a second voltage range broader than the first voltage range; and an output driver for maintaining a data output terminal at a high impedance state in response to the high-impedance drive data from the high-impedance controller/level shifter means and for performing an output driving operation in response to the pull-up and pull-down output data signals from the high-impedance controller/level shifter means to output final data externally through the data output terminal.

In accordance with another aspect of the present invention, there is provided a method for outputting data in a semiconductor device, comprising the steps of receiving and latching an internal input data signal with a first voltage range in response to a clock control signal to provide a pair of output data signals; level-shifting the output data signals using a level shifter while a high-impedance control signal maintains a first logic state, transferring the level-shifted signals respectively as pull-up and pull-down output data signals with a second voltage range broader than the first voltage range and applying the output data signals directly to the level shifter to generate high-impedance drive data for the control of a high impedance state, when the high-impedance control signal becomes a second logic state; and maintaining a data output terminal at a high impedance state in response to the high-impedance drive data and performing an output driving operation in response to the pull-up and pull-down output data signals to output final data externally through the data output terminal.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
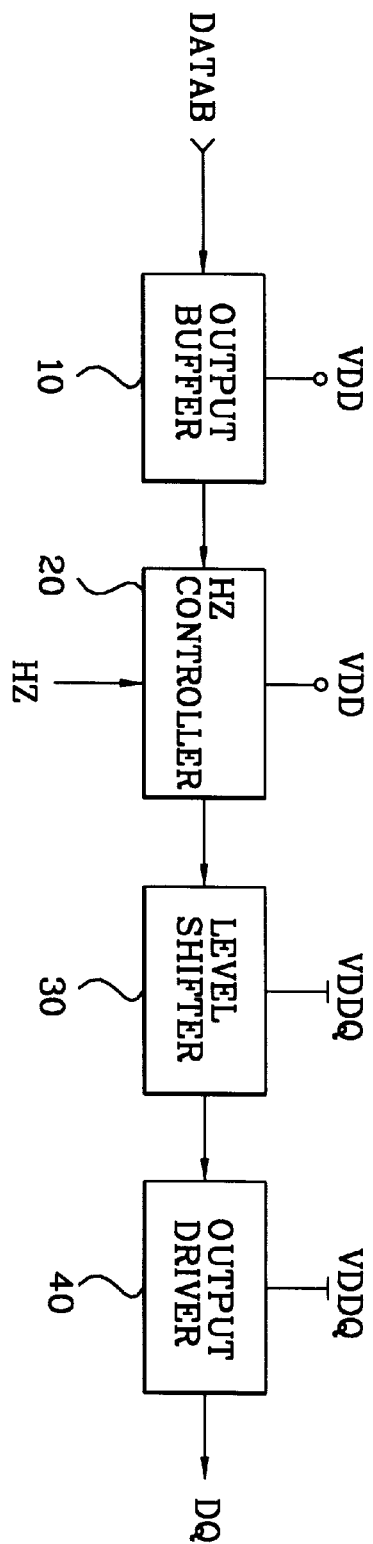
FIG. 1 is a schematic block diagram of a conventional data output circuit.

For the convenience of description and better understanding of the present invention, the same or like elements are denoted by the same or like reference numerals even though they are depicted in different drawings.

For a better understanding of the present invention, a description will first be given of a conventional data output circuit with reference to FIGS. 1 and 2.

Referring to FIG. 1, there is schematically shown in block form the construction of the conventional data output circuit, which comprises an output buffer 10, high-impedance (HZ) controller 20, level shifter 30 and output driver 40. In the drawing, the output buffer 10 and HZ controller 20 are shown to operate in response to an internal supply voltage VDD and the level shifter 30 and output driver 40 are shown to operate in response to an operating voltage VDDQ, which is higher in level than the internal supply voltage VDD. Here, the operating voltage VDDQ may be an external supply voltage and have any one value of about 1.8V, 2.5V, 3.3V or 5.5V as needed. Seeing the construction of FIG. 1, the output buffer 10 inputs a raw data signal pair DATAB and provides a primary output data signal pair that is applied to the HZ controller 20 for the generation of a secondary output data signal pair. Subsequently, the generated secondary output data signal pair is converted in voltage level by the level shifter 30 and then transferred to the output driver 40 for the generation of the final data pair DQ to be externally provided. It should be noted that a data output speed and a high-impedance transition speed become low because the output data is transferred along a long path based on the above various blocks, which will hereinafter be mentioned in more detail with reference to FIG. 2.

Figure 2:
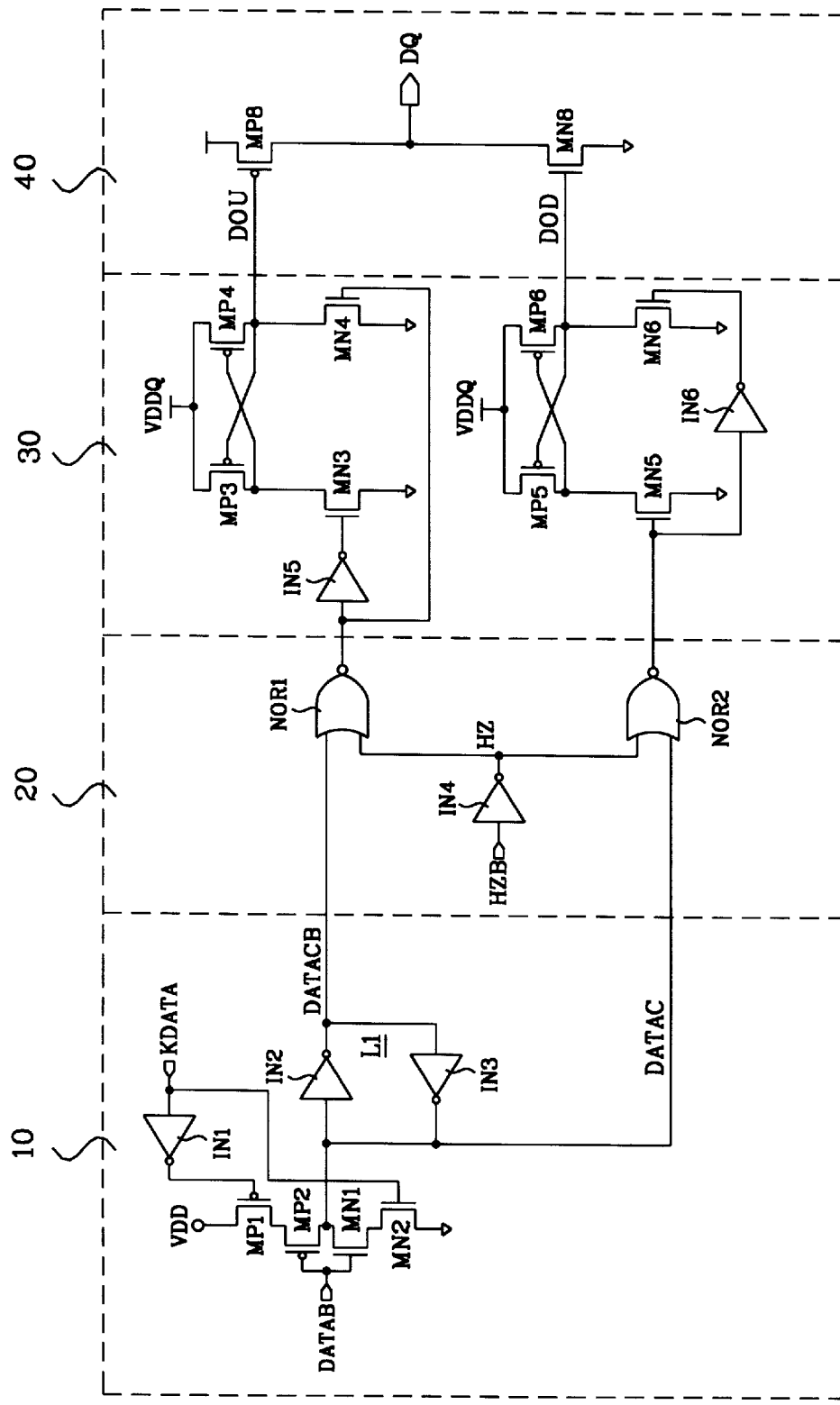
FIG. 2 is a detailed circuit diagram of the data output circuit in FIG. 1.

FIG. 2 is a detailed circuit diagram of the conventional data output circuit in FIG. 1. As shown in this drawing, the output buffer 10 includes a clocked CMOS inverter circuit consisting of p-channel MOS transistors MP1 and MP2, n-channel MOS transistors MN1 and MN2 and an inverter IN1, and a latch circuit L1 consisting of two inverters IN2 and IN3 forming a feedback loop.

The HZ controller 20 includes an inverter IN4 for inverting the inverted version HZB of a high-impedance control signal HZ, and two NOR gates NOR1 and NOR2 for receiving a pair of output data signals DATACB and DATAC from the inverters IN2 and IN3 in the latch circuit LI of the output buffer 10 at their one input terminals and an output signal from the inverter IN4 at their other input terminals and performing NORing operations for the received signals.

The level shifter 30 is provided with two level shifter elements connected respectively to output terminals of the NOR gates NOR1 and NOR2 in the HZ controller 20. The first level shifter element includes a pair of cross-coupled p-channel MOS transistors MP3 and MP4 having their gate terminals cross coupled to each other's drain terminals and their source terminals connected in common to the operating voltage VDDQ, an inverter IN5 for inverting an output signal from the NOR gate NOR1, and a differential transistor circuit provided with a pair of n-channel MOS transistors MN3 and MN4. The n-channel MOS transistors MN3 and MN4 have their drain-source channels formed respectively between the drain terminals of the cross-coupled p-channel MOS transistors MP3 and MP4 and a ground voltage, and their gate terminals receive the input signal to the inverter IN5, which is the output signal from the NOR gate NOR1.

Similar to the first level shifter element, the second level shifter element includes a pair of cross-coupled p-channel MOS transistors MP5 and MP6 having their gate terminals cross coupled to each other's drain terminals and their source terminals connected in common to the operating voltage VDDQ, an inverter IN6 for inverting an output signal from the NOR gate NOR2, and a differential transistor circuit provided with a pair of n-channel MOS transistors MN5 and MN6. The n-channel MOS transistors MN5 and MN6 have their drain-source channels formed respectively between the drain terminals of the cross-coupled p-channel MOS transistors MP5 and MP6 and the ground voltage and their gate terminals receive the output signal from the NOR gate NOR2 and the output signal from the inverter IN6, respectively.

The output driver 40 includes a pull-up transistor MP8 operating in response to the output DOU of the first level shifter element connected to the NOR gate NOR1, and a pull-down transistor MN8 operating in response to the output DOD of the second level shifter element connected to the NOR gate NOR2.

The operation of the conventional data output circuit with the above-mentioned construction will hereinafter be described with reference to FIG. 2.

In a read mode where data stored in a memory cell is externally outputted, if an input data signal DATAB with a first voltage range, such as a 0/3.3V swing range, is applied to an input terminal of the clocked CMOS inverter circuit in the output buffer 10 and a clock control signal KDATA is logic "high", then the input data signal DATAB is inverted in logic and appears at a drain terminal of the p-channel MOS transistor MP2. For example, in the case where the input data signal DATAB at the input terminal of the clocked CMOS inverter circuit is logic "high" within the first voltage range, then it appears as logic "low" at an input terminal of the inverter IN2 in the latch circuit L1.

Noticeably, the input data signal DATAB applied to the output buffer 10 may be any one of a pair of sense output signals SAS and SASB, which are provided from a main sense amplifier for sense-amplifying data on true and complementary bit lines connected to the memory cell. In the latch circuit L1 of the output buffer 10, the inverter IN2 provides the output data signal DATACB, which is high in logic, and the inverter IN3 provides the output data signal DATAC, which is low in logic. Here, the high and low logic output data signals DATACB and DATAC may be called an output data signal pair.

If the high logic output data signal DATACB from the inverter IN2 is applied to one input terminal of the NOR gate NOR1 in the HZ controller 20 and the high-impedance control signal HZ is applied as a second logic state, for example, logic low to the other input terminal of the NOR gate NOR1, then the output of the NOR gate NOR1 becomes low in logic, whereas the output of the NOR gate NOR2 goes high in logic. The output of the NOR gate NOR1 is applied to the first level shifter element in the level shifter 30. The first level shifter element is a differential cascode voltage switch logic (DCVSL) circuit which is a digital form of an analog differential amplifier. Upon receiving the output of the NOR gate NOR1, the first level shifter element performs a level shifting operation for transferring a pull-up output data signal DOU with a second voltage range as logic "high" through its output line. Here, the second voltage range is broader than the first voltage range, and the high logic state of the pull-up output data signal DOU may correspond to a voltage level of about 5V even though it is different according to different levels of the operating voltage VDDQ.

In a similar manner to the first level shifter element, the second level shifter element receives the output of the NOR gate NOR2 and performs a level shifting operation for transferring a pull-down output data signal DOD with the second voltage range being broader than the first voltage range as logic "high" through its output line. In this case, the high logic state of the pull-down output data signal DOD corresponds to a high level within the second voltage range. In the level shifter 30, the drain terminals of the p-channel MOS transistors MP4 and MP6 correspond respectively to the above output lines, which may be called an output line pair. Then, in the output driver 40, the pull-up transistor MP8 is turned off because it acts as a p-channel MOS transistor, and the pull-down transistor MN8 is turned on because it acts as an n-channel MOS transistor. As a result, the final output data becomes low in logic. In this case, since the low logic state of the final output data can be regarded as a level of 0V, it is unreasonable to characterize the output data as having been substantially shifted in level. However, in the case where the final output data is high in logic, it may be fairly characterized as having been substantially shifted in level.

To the contrary of the above case where the output data is provided as logic low, in FIG. 2, if the input data signal DATAB at the input terminal of the clocked CMOS inverter circuit is logic "low" within the first voltage range, then it appears as logic "high" at the input terminal of the inverter IN2 in the latch circuit L1. In the latch circuit L1, the inverter IN2 provides the output data signal DATACB as logic low and the inverter IN3 provides the output data signal DATAC as logic high. If the low logic output data signal DATACB from the inverter IN2 is applied to one input terminal of the NOR gate NOR1 in the HZ controller 20 and the high-impedance control signal HZ is applied as logic low to the other input terminal of the NOR gate NOR1, then the output of the NOR gate NOR1 goes high in logic, whereas the output of the NOR gate NOR2 becomes low in logic. Upon receiving the output of the NOR gate NOR1, the first level shifter element provides the pull-up output data signal DOU as logic "low". On the other hand, the second level shifter element receives the output of the NOR gate NOR2 and performs a level shifting operation for providing the pull-down output data signal DOD with the second voltage range broader than the first voltage range as logic "low". Then, in the output driver 40, the pull-up transistor MP8 is turned on, whereas the pull-down transistor MN8 is turned off. As a result, the final output data DQ becomes logic "high" within the second voltage range. In this case, the high logic state of the final output data corresponds to a level of about 5V when the internal supply voltage VDD has a level of about 3.3V and the operating voltage VDDQ has the level of about 5V. Therefore, the final output data can be recognized to be substantially shifted in level.

On the other hand, in either a write mode or a standby mode, not the read mode, the high-impedance control signal HZ is applied as logic high. As a result, the inverted one HZB of the high-impedance control signal HZ is low in logic. In this case, the outputs of the NOR gates NOR1 and NOR2 in the HZ controller 20 become both "low" in logic regardless of the logic states of the output data signal pair DATACB/DATAC. Then, the first level shifter element receives the output of the NOR gate NOR1 and provides the pull-up output data signal DOU as logic "high", and the second level shifter element receives the output of the NOR gate NOR2 and provides the pull-down output data signal DOD as logic "low". As a result, the pull-up and pull-down transistors MP8 and MN8 in the output driver 40 are both turned off, thereby causing an output terminal of the data output circuit to become a "high impedance" state.

In the data output circuit of FIG. 2, for the output of the final data DQ, the HZ controller 20, level shifter 30 and output driver 40 must be sequentially operated after the input data signal DATAB is applied to the output buffer 10. For this reason, the data output operation is performed along a long path, resulting in relative reductions in data output speed and high-impedance transition speed. In particular, the data output speed is a critical element in a high speed transceiver logic (HSTL) interface or an LVTTL interface. Because the gating operation of the HZ controller 20 and the level shifting operation of the level shifter 30 require a considerable amount of time, they exert a great undesirable effect on reducing data output speed. Further, the conventional level shifter circuit shown in FIG. 2 has a pull-up transition period of time different according to various external supply voltage levels. As a result, it is difficult to adjust the data output speed using one level shifter circuit, and a skew may occur between output signals due to a difference between output pull-up and pull-down speeds.

Therefore, in order to overcome the above problems, the present invention provides a data output circuit which is capable of enhancing the data output speed and high-impedance transition speed and removing or at least greatly minimizing the time skew between the output signals in the pull-up and pull-down operations.

For reference, the level shifter herein and the associated techniques are shown in various prior arts. For example, a level-shifting circuit is disclosed in U.S. Pat. No. 5,723,986 and an output buffer for a semiconductor memory device with a level shifting circuit is disclosed in U.S. Pat. No. 5,476,313.

Now, the construction and operation of a data output circuit in accordance with the present invention will be described with reference to FIGS. 3 and 4.

Figure 3:
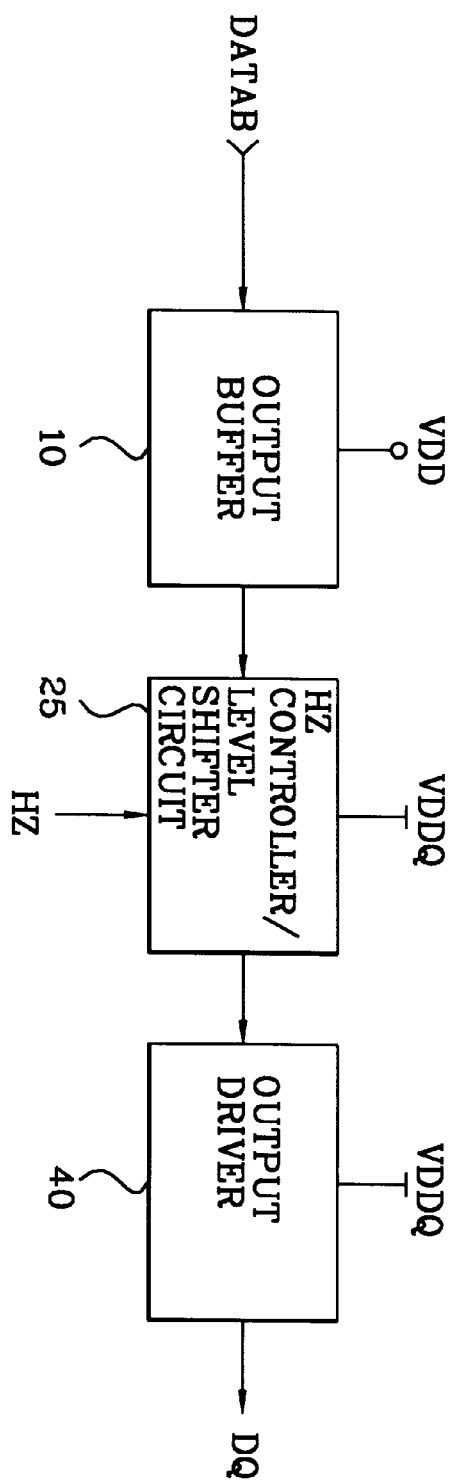
FIG. 3 is a schematic block diagram of a data output circuit in accordance with the present invention.

Referring to FIG. 3, there is schematically shown in block form the construction of the data output circuit in accordance with the present invention. Comparing the construction of FIG. 3 with that of FIG. 1, the output buffer 10 and output driver 40 in FIG. 3 are the same as those in FIG. 1 and one circuit block, or HZ controller/level shifter circuit 25, is shown in FIG. 3 instead of the HZ controller 20 and level shifter 30 in FIG. 1. In FIG. 3, the output buffer 10 is shown to operate in response to an internal supply voltage VDD and the remaining blocks are shown to operate in response to an operating voltage VDDQ, which is higher in level than the internal supply voltage VDD. Here, the operating voltage VDDQ may be an external supply voltage and have any one value of about 1.8V, 2.5V, 3.3V or 5.5V as needed. The block construction of FIG. 3 is derived not from the mere substitution of two blocks in FIG. 1 with one block, but from a solution to the above-mentioned conventional problems, which will be more clearly understood from the following detailed description taken in conjunction with FIG. 4.

Figure 4:
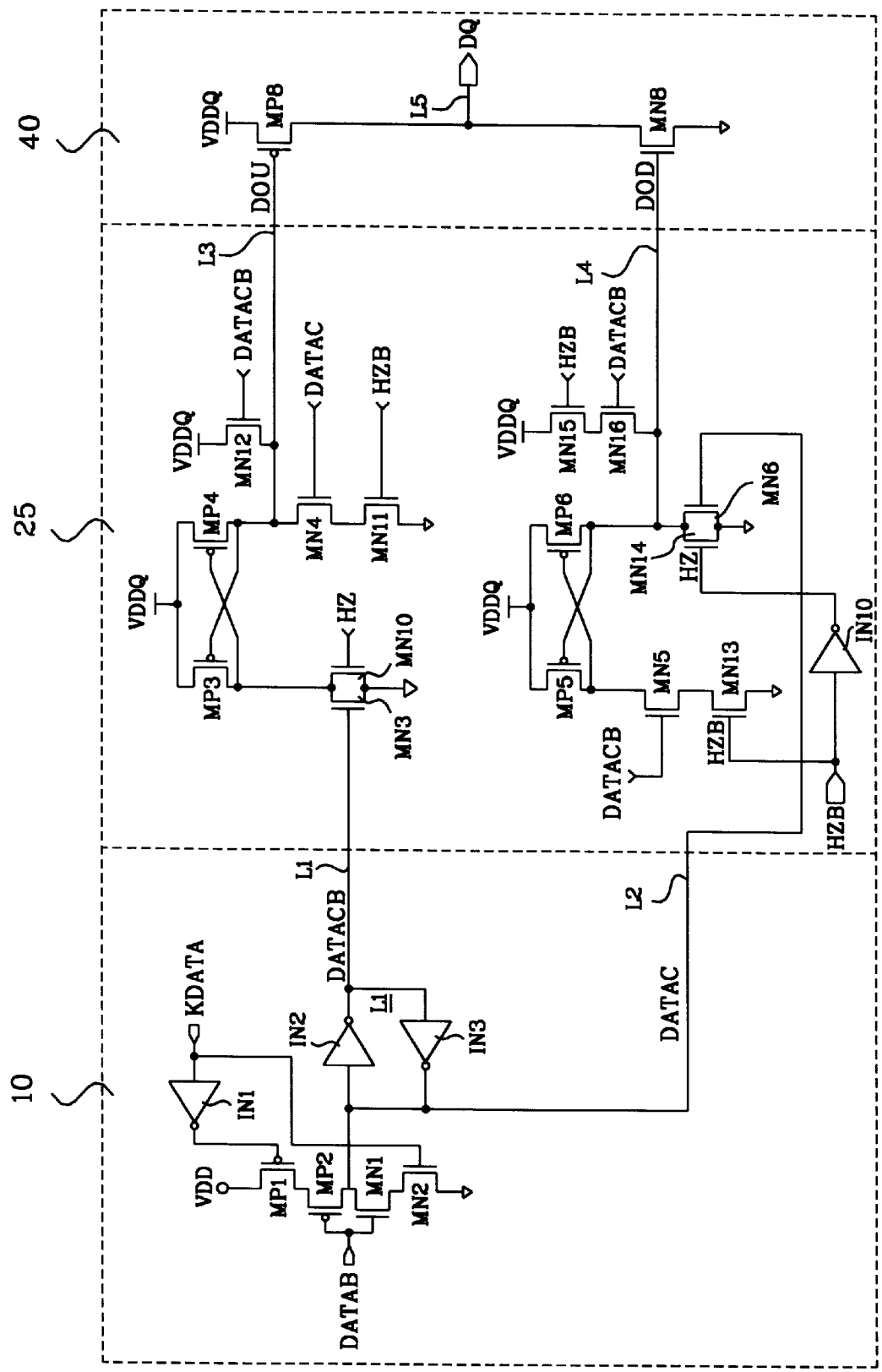
FIG. 4 is a detailed circuit diagram of the data output circuit in FIG. 3 in accordance with the preferred embodiment of the present invention.

FIG. 4 is a detailed circuit diagram of the data output circuit in FIG. 3 in accordance with the preferred embodiment of the present invention. As shown in this drawing, the output buffer 10 is adapted to receive and latch an input data signal DATAB with a first voltage range in response to a clock control signal KDATA to provide a pair of output data signals DATACB and DATAC. The high-impedance controller/level shifter circuit 25 is adapted to output high-impedance drive data for the control of a high impedance state through a pair of output lines L3 and L4 according to a first logic state, for example, logic "high" of a high-impedance control signal HZ. The high-impedance controller/level shifter circuit 25 is also adapted to receive the output data signal pair DATACB/DATAC from the output buffer 10 according to a second logic state of the high-impedance control signal HZ and transfer a pull-up output data signal DOU and a pull-down output data signal DOD through the output lines L3 and L4, respectively. Those of skill in the art will appreciate that each of the pull-up and pull-down output data signals DOU and DOD has a second voltage range broader than the first voltage range. The output driver 40 is adapted to maintain a data output terminal L5 at the high-impedance state in response to the high-impedance drive data from the high-impedance controller/level shifter circuit 25. The output driver 40 is further adapted to perform an output driving operation in response to the pull-up and pull-down output data signals DOU and DOD from the high-impedance controller/level shifter circuit 25 to output the final data DQ externally through the data output terminal L5.

In FIG. 4, the detailed constructions of the output buffer 10 and output driver 40 are substantially the same as those in FIG. 2 and a description thereof will thus be omitted. The HZ controller/level shifter circuit 25 is a level shifter improved according to a technical concept of the present invention, and it is provided with two level shifter elements.

The first level shifter element includes a pair of cross-coupled p-channel MOS transistors MP5 and MP6 having their gate terminals cross coupled to each other's drain terminals and their source terminals connected in common to the operating voltage VDDQ, and a differential transistor circuit provided with a pair of n-channel MOS transistors MN5 and MN6. The n-channel MOS transistors MN5 and MN6 have their drain-source channels formed respectively between the drain terminals of the cross-coupled p-channel MOS transistors MP5 and MP6 and a ground voltage to define first and second current paths, and their gate terminals receive output data signals DATACB and DATAC with the first voltage range from the output buffer 10, respectively.

The first level shifter element further includes a high-impedance control circuit provided with a pair of n-channel MOS transistors MN13 and MN14. The n-channel MOS transistor MN13 has its drain-source channel formed between a source terminal of the n-channel MOS transistor MN5 defining the first current path and the ground voltage and its gate terminal receiving a first high-impedance control signal HZB. The n-channel MOS transistor MN 14 has its drain-source channel connected in parallel to the drain-source channel of the n-channel MOS transistor MN6 defining the second current path, and its gate terminal for receives a second high-impedance control signal HZ, which has the opposite logic state to that of the first high-impedance control signal by inversion via an inverter IN10.

The first level shifter element is further provided with a pull-up circuit including a pair of n-channel MOS transistors MN15 and MN16 connected in series to the drain terminal of the p-channel MOS transistor MP6. The n-channel MOS transistors MN15 and MN16 have their drain-source channels connected in series between the output line L4 transferring the pull-down output data signal DOD with the second voltage range and the operating voltage VDDQ, and their gate terminals receive the first high-impedance control signal HZB and the output data signal DATACB from the output buffer 10, respectively.

The second level shifter element includes a pair of cross-coupled p-channel MOS transistors MP3 and MP4 having their gate terminals cross coupled to each other's drain terminals and their source terminals connected in common to the operating voltage VDDQ, and a differential transistor circuit provided with a pair of n-channel MOS transistors MN3 and MN4. The n-channel MOS transistors MN3 and MN4 have their drain-source channels formed respectively between the drain terminals of the cross-coupled p-channel MOS transistors MP3 and MP4 and the ground voltage to define first and second current paths, and their gate terminals receive the output data signals DATACB and DATAC with the first voltage range from the output buffer 10, respectively.

The second level shifter element further includes a high-impedance control circuit provided with a pair of n-channel MOS transistors MN10 and MN11. The n-channel MOS transistor MN11 has its drain-source channel formed between a source terminal of the n-channel MOS transistor MN4 defining the second current path and the ground voltage, and its gate terminal receives the first high-impedance control signal HZB. The n-channel MOS transistor MN10 has its drain-source channel connected in parallel to the drain-source channel of the n-channel MOS transistor MN3 defining the first current path, and its gate terminal receives the second high-impedance control signal HZ, which has the opposite logic state to that of the first high-impedance control signal.

The second level shifter element is further provided with a pull-up circuit including an n-channel MOS transistor MN12 connected to the drain terminal of the p-channel MOS transistor MP4. The n-channel MOS transistor MN12 has its drain-source channel formed between the output line L3 transferring the pull-up output data signal DOU with the second voltage range and the operating voltage VDDQ, and its gate terminal receives the output data signal DATACB from the output buffer 10.

Importantly, in accordance with the invention, there is no delay resulting from the gating operation because the NOR gates NOR1 and NOR2 of FIG. 2 are removed.

Next, a detailed description will be given of the operation of the data output circuit with the above-mentioned construction in accordance with the preferred embodiment of the present invention.

In a read mode of a semiconductor memory device where data stored in a memory cell is externally outputted, if the input data signal DATAB at the input terminal of the output buffer 10 is logic "high" within the first voltage range, then it appears as logic "low" at the input terminal of the inverter IN2. In the output buffer 10, the inverter IN2 provides the output data signal DATACB as logic high and the inverter IN3 provides the output data signal DATAC as logic low. Then, in the pull-up level shifter element of the HZ controller/level shifter circuit 25, the high logic output data signal DATACB from the inverter IN2 is applied to the gate terminals of the n-channel MOS transistors MN3 and MN12. If the second high-impedance control signal HZ is applied as the second logic state, for example, logic low to the gate terminal of the n-channel MOS transistor MN1O, the first high-impedance control signal HZB is applied as logic high to the gate terminal of the n-channel MOS transistor MN11 because it is the inverted one of the second high-impedance control signal HZ. The low logic output data signal DATAC from the inverter IN3 is applied to the gate terminal of the n-channel MOS transistor MN4. As a result, the n-channel MOS transistors MN3, MN11 and MN12 are all turned on, whereas the n-channel MOS transistors MN10 and MN4 are both turned off.

As the n-channel MOS transistor MN3 is turned on, a gate voltage of the p-channel MOS transistor MP4 is dropped to a ground voltage level, for example, 0V, thereby causing the p-channel MOS transistor MP4 to be turned on to transfer the operating voltage VDDQ to the output line L3. If the operating voltage VDDQ on the output line L3 has the maximum level, the p-channel MOS transistor MP3 is completely turned off because its gate terminal is connected to the output line L3. In this case, since the n-channel MOS transistor MN4 remains off although the n-channel MOS transistor MN11 remains on, the high level voltage on the output line L3 is applied to the gate terminal of the pull-up transistor MP8 in the output driver 40, directly without any reduction in level within the second voltage range (from 0V to VDDQ). Here, the n-channel MOS transistor MN12 acts to rapidly pull up the output line L3 to the level of the operating voltage VDDQ when the input data signal DATAB is "high" in logic.

In other words, if the input data signal DATAB is "low" in logic, the output line L3 has a level of about 0V. For this reason, in the case where the input data signal DATSB is subsequently applied as logic "high", a considerable amount of time is required in boosting the output line L3 sufficiently to the level of the operating voltage VDDQ. In this connection, in order to minimize the pull-up time, the n-channel MOS transistor MN12 receives the operating voltage VDDQ directly at its drain terminal and transfers it to the output line L3 in the above case. As a result, the pull-up output data signal DOU with the second voltage range wider than the first voltage range is rapidly transferred as logic "high" to the output line L3.

It is common in conventional circuits that the pull-up speed is lower than the pull-down speed, resulting in the occurrence of a time skew between output signals. In the present embodiment, the n-channel MOS transistor MN12 functions to minimize the time skew in the pull-up and pull-down operations. Such minimization of the time skew signifies that a latch operation is rapidly performed after triggering. In accordance with the present invention, however, prevention of leakage current is the reason why the n-channel MOS transistor MN12 is used as a transistor for the high-speed pull-up operation. That is, in the case where a given transistor is of the p-channel type, it may always be turned on irrespective of its gate voltage when the external supply voltage is high in level.

Furthermore, the use of the n-channel MOS transistor MN12 allows the pull-up transistor MP8 in the output driver 40 to have a sufficient driving capability with no increase in its size. Consequently, the input data signal DATAB is applied to the level shifter element connected to the output line L3, directly without being subjected to the logic gating operation, and then rapidly transferred as the high logic pull-up output data signal DOU by the high-speed level shifting operation of the level shifter element. The high logic state of the pull-up output data signal DOU may correspond to a voltage level of about 5V even though it is different according to different levels of the operating voltage VDDQ.

On the other hand, the pull-down level shifter element connected to the output line L4 is operated in the following manner. Namely, in the case where the input data signal DATAB is "high" in logic similarly to the above case, the low logic output data signal DATAC from the inverter IN3 is applied to the gate terminal of the n-channel MOS transistor MN6. The second high-impedance control signal HZ is applied as logic low to the gate terminal of the n-channel MOS transistor MN14 and the first high-impedance control signal HZB is applied as logic high to the gate terminals of the n-channel MOS transistors MN13 and MN15 because it is the inverted version of the second high-impedance control signal HZ.

The high logic output data signal DATACB from the inverter IN2 is applied to the gate terminals of the n-channel MOS transistors MN5 and MN16. As a result, the n-channel MOS transistors MN5, MN13, MN15 and MN16 are all turned on, whereas the n-channel MOS transistors MN14 and MN6 are both turned off. As the n-channel MOS transistors MN5 and MN13 are turned on, a gate voltage of the p-channel MOS transistor MP6 is dropped to the ground voltage level, for example, 0V, thereby causing the p-channel MOS transistor MP6 to be turned on to transfer the operating voltage VDDQ to the output line L4.

The first current path is defined by the drain-source channel of the differential transistor MN5 and the second current path is defined by the drain-source channel of the differential transistor MN6. If the operating voltage VDDQ on the output line L4 has the maximum level, the p-channel MOS transistor MP5 is completely turned off because its gate terminal is connected to the output line L4. In this case, since the n-channel MOS transistors MN14 and MN6 remain both off, the high-level voltage on the output line L4 is applied to the gate terminal of the pull-down transistor MN8 in the output driver 40, directly without any reduction in level within the second voltage range. Here, the n-channel MOS transistors MN15 and MN16 act to rapidly pull up the output line L4 to the level of the operating voltage VDDQ when the input data signal DATAB is "high" in logic.

Consequently, the input data signal DATAB is applied to the level shifter element connected to the output line L4, directly without being subjected to the logic gating operation, and then rapidly transferred as the high logic pull-down output data signal DOD by the high-speed level shifting operation of the level shifter element. Then, the level-shifted pull-up and pull-down output data signals DOU and DOD on the output lines L3 and L4 are applied respectively as logic high to the output driver 40. In the output driver 40, the pull-up transistor MP8 is turned off because it acts as a p-channel MOS transistor, and the pull-down transistor MN8 is turned on because it acts as an n-channel MOS transistor. As a result, the final output data becomes low in logic within the second voltage range.

A complementary operation occurs where the output data is provided as logic low. Referring still to FIG. 4, if the input data signal DATAB at the input terminal of the output buffer 10 is logic "low" within the first voltage range, then it appears as logic "high" at the input terminal of the inverter IN2. As a result, the output buffer 10 provides the output data signal DATACB as logic low and the output data signal DATAC as logic high. Then, in the pull-up level shifter element of the HZ controller/level shifter circuit 25, the low logic output data signal DATACB from the output buffer 10 is applied to the gate terminals of the n-channel MOS transistors MN3 and MN12.

If the second high-impedance control signal HZ is applied as logic low to the gate terminal of the n-channel MOS transistor MN10, the first high-impedance control signal HZB is applied as logic high to the gate terminal of the n-channel MOS transistor MN11 because it is the inverted version of the second high-impedance control signal HZ. The high logic output data signal DATAC from the output buffer 10 is applied to the gate terminal of the n-channel MOS transistor MN4. As a result, the n-channel MOS transistors MN4 and MN11 are both turned on, whereas the n-channel MOS transistors MN3, MN10 and MN12 are all turned off. As the n-channel MOS transistors MN4 and MN11 are turned on, a gate voltage of the p-channel MOS transistor MP3 is dropped to the ground voltage level, for example, 0V, thereby causing the p-channel MOS transistor MP3 to be turned on.

The turning on of the p-channel MOS transistor MP3 causes the gate voltage of the p-channel MOS transistor MP4 to rise to the level of the operating voltage VDDQ. As a result, the p-channel MOS transistor MP4 is completely turned off and the voltage level of the output line L3 falls to 0V through the n-channel MOS transistors MN4 and MN11. The n-channel MOS transistor MN12 does not act to transfer the operating voltage VDDQ to the output line L3 because it remains off. Consequently, the pull-up output data signal DOU is rapidly transferred as logic "low" to the output line L3. On the other hand, the pull-down output data signal DOD is rapidly transferred as logic "low" to the output line L4 by the level shifting operation of the pull-down level shifter element connected to the output line L4. Then, the level-shifted pull-up and pull-down output data signals DOU and DOD on the output lines L3 and L4 are applied respectively as logic low to the output driver 40. In the output driver 40, the pull-up transistor MP8 is turned on because it acts as a p-channel MOS transistor, and the pull-down transistor MN8 is turned off because it acts as an n-channel MOS transistor. As a result, the final output data becomes high in logic within the second voltage range. From the above-mentioned operation of the data output circuit of the present invention, it can be seen that the data output speed is relatively high as compared with the conventional data output circuit.

Under alternative conditions, e.g. in either a write mode or a standby mode of the semiconductor memory device as opposed to a read mode, the second high-impedance control signal HZ is applied as logic high. As a result, the first high-impedance control signal HZB, which is the inverted one of the second high-impedance control signal HZ, is low in logic. In this case, the n-channel MOS transistors in the HZ controller/level shifter circuit 25 are operated in response to the first and second high-impedance control signals HZB and HZ received at their gate terminals to transfer the pull-up output data signal DOU as logic "high" and the pull-down output data signal DOD as logic "low", respectively. Then, in the output driver 40, the pull-up transistor MP8 and pull-down transistor MN8 are both turned off, thereby causing the output terminal L5 to relatively rapidly become the "high impedance" state as compared with the conventional data output circuit.

In other words, because the first and second high-impedance control signals HZB and HZ are not combined with the output data signals DATACB and DATAC, they are applied to the HZ controller/level shifter circuit 25 directly, without being applied to logic gating elements. Consequently, the pull-up output data signal DOU for the control of the high impedance state is directly transferred as logic "high" and the pull-down output data signal DOD for the control of the high impedance state is directly transferred as logic "low", resulting in an improvement in high-impedance transition speed.

Therefore, the present invention can solve the above-mentioned conventional problems by enhancing the data output speed and high-impedance transition speed and removing or minimizing the time skew between the output signals in the pull-up and pull-down operations without suffering a leakage current problem. Further, the present invention allows the output driver 40 to have a sufficient driving capability with no increase in its transistor size.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For example, the transistors in the HZ controller/level shifter circuit may be increased or reduced in number and each of the pull-up and pull-down transistors may be of a different channel type or substituted with a bipolar transistor. These and other changes to the described circuit are within the spirit and scope of the invention.

As is apparent from the above description, according to the present invention, the data output circuit with the improved level shifter is capable of enhancing the data output speed and high-impedance transition speed and removing or minimizing the time skew between the output signals in the pull-up and pull-down operations without suffering a leakage current problem. Further, the data output circuit is able to enhance the current driving capability of the output driver. Therefore, the present invention is advantageously applicable to a higher-speed semiconductor device.

What is claimed is:

1. A data output circuit for a semiconductor device, comprising:

an output buffer configured to receive and latch an input data signal with a first voltage range in response to a clock control signal to provide a pair of output data signals;

a level shifting circuit comprising both a level shifter and an impedance controller, wherein said level shifting circuit is configured to output impedance drive data to control an impedance state through a pair of output lines in response to a first logic state of an impedance control signal, and wherein said level shifting circuit is further configured to directly receive said output data signal pair from said output buffer in response to a second logic state of said impedance control signal and to transfer a pull-up output data signal and a pull-down output data signal through said output lines, respectively, each of said pull-up and pull-down output data signals having a second voltage range broader than said first voltage range;

wherein said level-shifting circuit further comprising a pair of cross-coupled transistors having their gate terminals cross coupled to each other's drain terminals and their source terminals connected in common to an operating voltage; differential transistor means including a pair of transistors having their drain-source channels formed respectively between said drain terminals of said cross-coupled transistors and a ground voltage to define first and second current paths, and having their gate terminals for receiving a pair of output data signals with a first voltage range; high-impedance control means including a pair of transistors, the first said transistor having its drain-source channel formed between a source terminal of said first transistor defining said first current path and said ground voltage and having its gate terminal for receiving a first high-impedance control signal, the second said transistor having its drain-source channel connected in parallel to said drain-source channel of said second transistor defining said second current path, and having its gate terminal for receiving a second high-impedance control signal, said second high-impedance control signal having the opposite logic state to that of said first high-impedance control signal; and pull-up means including a pair of transistors connected in series to any one of said drain terminals of said cross-coupled transistors, said first and second transistors having their drain-source channels connected in series between an output line transferring a pull-down output data signal with a second voltage range and said operating voltage, and having their gate terminals for receiving said first high-impedance control signal and any one of said output data signals; and an output driver for maintaining a data output terminal at said impedance state in response to said impedance drive data from said level shifting circuit and for performing an output driving operation in response to said pull-up and pull-down output data signals from said level shifting circuit to output final data externally through said data output terminal.

2. A data output circuit for a semiconductor device, as set forth in claim 1, wherein said output buffer includes a clocked CMOS inverter circuit and an inverter latch circuit.

3. A data output circuit for a semiconductor device, as set forth in claim 1, wherein said first logic state of said high-impedance control signal is logic "high" and said second logic state thereof is logic "low".

4. A data output circuit for a semiconductor device, as set forth in claim 1, wherein said semiconductor device is a volatile semiconductor memory device.

5. A level shifting circuit as set forth in claim 1, wherein said second high-impedance control signal has a high logic state in either a write mode or a standby mode.

6. A level shifting circuit as set for th in claim 1, wherein said second high-impedance control signal has a low logic state in a read mode.

* * * * *